United States Patent
Chung et al.

(10) Patent No.: US 8,614,876 B2
(45) Date of Patent: Dec. 24, 2013

(54) MULTILAYER CERAMIC CAPACITOR

(75) Inventors: Hae Suk Chung, Seoul (KR); Dae Bok Oh, Seoul (KR); Eun Hye Choi, Gyunggi-do (KR); Eun Hyuk Chae, Gyunggi-do (KR); Kang Heon Hur, Gyunggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 134 days.

(21) Appl. No.: 13/282,138

(22) Filed: Oct. 26, 2011

(65) Prior Publication Data

US 2012/0268859 A1 Oct. 25, 2012

(30) Foreign Application Priority Data

Apr. 19, 2011 (KR) ........................ 10-2011-0036196

(51) Int. Cl.
*H01G 4/06* (2006.01)
(52) U.S. Cl.
USPC .................. 361/321.2; 361/321.1; 361/306.1; 361/306.3; 361/301.4; 361/303
(58) Field of Classification Search
USPC ................ 361/321.2, 321.1, 303–305, 306.1, 361/306.3, 311–313
See application file for complete search history.

(56) References Cited

U.S. PATENT DOCUMENTS

| | | | | |
|---|---|---|---|---|
| 7,394,643 B2* | 7/2008 | Yamane et al. | ............... | 361/303 |
| 7,715,172 B2* | 5/2010 | Kawasaki et al. | ............. | 361/303 |
| 7,859,821 B2* | 12/2010 | Shimizu | ..................... | 361/306.3 |
| 8,149,566 B2* | 4/2012 | Motoki et al. | ................. | 361/305 |
| 8,254,081 B2* | 8/2012 | Nishihara et al. | ............. | 361/300 |
| 2006/0126264 A1 | 6/2006 | Yoshii et al. | | |
| 2006/0238948 A1* | 10/2006 | Tominaga | ..................... | 361/118 |

FOREIGN PATENT DOCUMENTS

JP 2001-210545 8/2001

* cited by examiner

*Primary Examiner* — Nguyen T Ha
(74) *Attorney, Agent, or Firm* — McDermott Will & Emery LLP

(57) ABSTRACT

There is provided a multilayer ceramic capacitor including: a ceramic body including dielectric layers and internal electrodes stacked between the dielectric layers; and a pair of external electrodes each fixed to first and second surfaces of the ceramic body, facing each other, and connected to the internal electrodes, wherein the ceramic body has a third surface facing a printed circuit board and each of the pair of external electrodes includes mounting parts extended onto the third surface and having a preset length by which they are mounted on the printed circuit board and wherein connection parts between the pair of external electrodes and the mounting parts have a convexly curved shape having a size equal to or smaller than a preset corner radius.

3 Claims, 2 Drawing Sheets

MULTILAYER CERAMIC CAPACITOR

CROSS-REFERENCE TO RELATED APPLICATIONS

This application claims the priority of Korean Patent Application No. 10-2011-0036196 filed on Apr. 19, 2011, in the Korean Intellectual Property Office, the disclosure of which is incorporated herein by reference.

BACKGROUND OF THE INVENTION

1. Field of the Invention

The present invention relates to a multilayer ceramic capacitor for preventing a tombstone phenomenon generated at the time of mounting the multilayer ceramic capacitor on a printed circuit board.

2. Description of the Related Art

In accordance with the recent trend for the miniaturization of electronic devices, the use of a surface mounting substrate has increased. Therefore, chip components mounted on the surface mounting substrate have been continuously miniaturized. A capacitor, a type of chip component, has been widely used for various purposes in analog and digital electronic circuits.

Generally, a capacitor, an element capable of storing electricity therein, includes two electrodes facing each other, such that when it has a voltage applied thereto, electricity is accumulated in each of the electrodes. In the case in which a direct current (DC) voltage is applied to the capacitor, a current flows in the capacitor during the accumulation of electricity and does not flow therein when the accumulation of electricity is completed.

In addition, in the case in which an alternate current (AC) voltage is applied to the capacitor, the polarities of the electrodes are alternated, such that an AC current continuously flows therein. A performance of the capacitor is represented by capacitance F. A multilayer capacitor capable of implementing high capacitance in spite of having a small size has been widely used as the capacitor. The multilayer capacitor is widely used as a decoupling capacitor connected between a semiconductor chip and a power supply in a power supply circuit of a large scale integrated circuit (LSI), or the like.

However, as the multilayer capacitor has been gradually miniaturized, when it is mounted on a printed circuit board, a tombstone phenomenon may be generated. The tombstone phenomenon is a phenomenon in which, when a multilayer ceramic capacitor is mounted on a printed circuit board, an external electrode on any one side of external electrodes of the multilayer ceramic capacitor stands up in the manner of a tombstone due to the surface tension of fusion welding. The tombstone phenomenon causes serious defects in printed circuit boards.

SUMMARY OF THE INVENTION

An aspect of the present invention provides a multilayer ceramic capacitor capable of reducing defects of a printed circuit board by preventing a tombstone phenomenon.

According to an aspect of the present invention, there is provided a multilayer ceramic capacitor including: a ceramic body including dielectric layers and internal electrodes stacked between the dielectric layers; and a pair of external electrodes each fixed to first and second surfaces of the ceramic body, facing each other, and connected to the internal electrodes, wherein the ceramic body has a third surface facing a printed circuit board and each of the pair of external electrodes includes mounting parts extended onto the third surface and having a preset length by which they are mounted on the printed circuit board and wherein connection parts between the pair of external electrodes and the mounting parts have a convexly curved shape having a size equal to or smaller than a preset corner radius.

The multilayer ceramic capacitor may have a first length in a first direction corresponding to a direction in which the internal electrodes are stacked, a second length in a second direction corresponding to a direction in which the pair of external electrodes face each other, and a third length in a third direction corresponding to a direction perpendicular to both of the first and second directions, and in a reverse type multilayer ceramic capacitor having the third length longer than the second length, when the first length is 0.2 mm, the second length is 0.3 mm, and the third length is 0.6 mm, the corner radius may be 50 μm or less and the length of the mounting part may be 50 μm or more and 100 μm or less.

The multilayer ceramic capacitor may have a first length in the first direction corresponding to the direction in which the internal electrodes are stacked, a second length in the second direction corresponding to the direction in which the pair of external electrodes face each other, and a third length in the third direction corresponding to the direction perpendicular to both of the first and second directions, and in the reverse type multilayer ceramic capacitor having the third length longer than the second length, when the first length is 0.3 mm, the second length is 0.5 mm, and the third length is 1.0 mm, the corner radius may be 50 μm or less and the length of the mounting part may be 50 μm or more and 200 μm or less.

According to another aspect of the present invention, there is provided a multilayer ceramic capacitor including: a ceramic body including dielectric layers and internal electrodes alternately stacked between the dielectric layers; and multiple pairs of external electrodes each fixed to first and second surfaces of the ceramic body, facing each other, and connected to the internal electrodes, wherein the ceramic body has a third surface facing a printed circuit board and each of the multiple pairs of external electrodes includes mounting parts extended onto the third surface and having a preset length by which they are mounted on the printed circuit board, and wherein connection parts between the multiple pairs of external electrodes and the mounting parts have a convexly curved shape having a size equal to or smaller than a preset corner radius.

The multilayer ceramic capacitor may have a first length in a first direction corresponding to a direction in which the internal electrodes are stacked, a second length in a second direction corresponding to a direction in which the multiple pairs of external electrodes face each other, and a third length in a third direction corresponding to a direction perpendicular to both of the first and second directions, and when the first length is 0.45 mm, the second length is 0.6 mm, and the third length is 0.9 mm, the corner radius may be 50 μm or less and the length of the mounting part may be 100 μm or more and 250 μm or less.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1A:
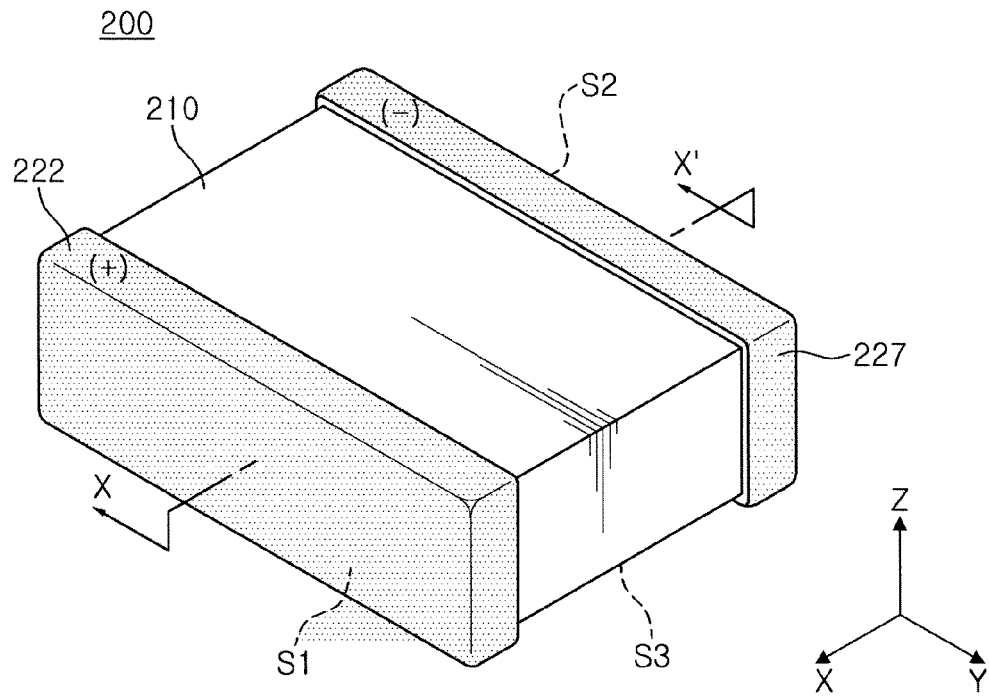
FIG. 1A is a perspective view showing a reverse type multilayer ceramic capacitor according to an embodiment of the present invention.

Embodiments of the present invention will be described with reference to the accompanying drawings. The embodiments of the present invention may be modified in many different forms and the scope of the invention should not be construed as being limited to the embodiments set forth herein. Rather, these embodiments are provided so that this disclosure will be thorough and complete, and will fully convey the concept of the invention to those skilled in the art. Therefore, it is to be noted that the shape and size of components shown in the drawings may be exaggerated in order to provide clarity in description.

Figure 2:
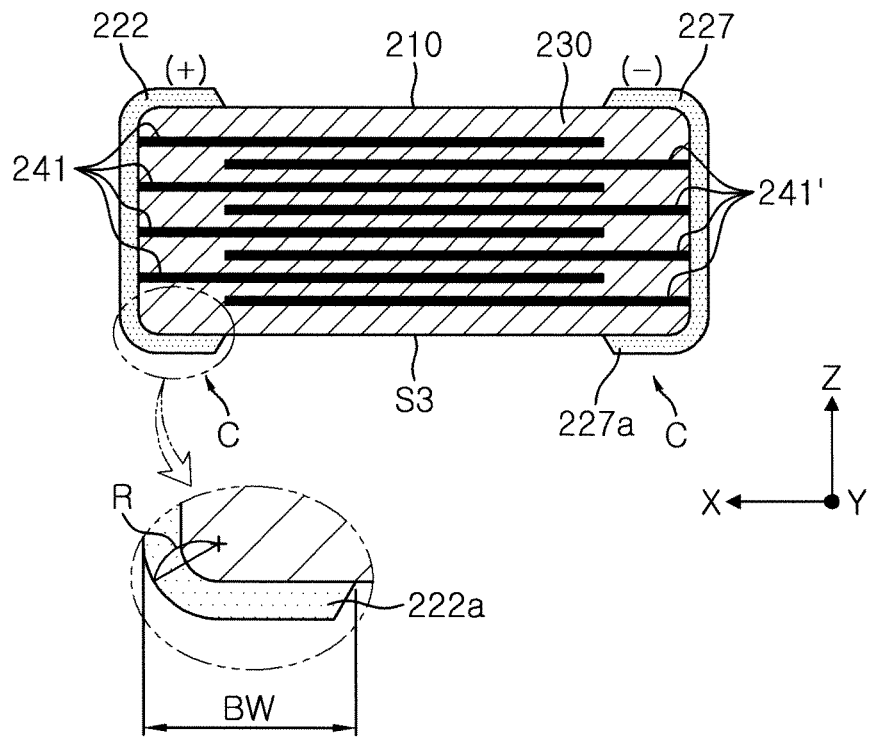
FIG. 2 is a schematic cross-sectional view of a multilayer ceramic capacitor taken along line X-X' of FIGS. 1A and 1B.

FIG. 1A is a perspective view showing a reverse type multilayer ceramic capacitor according to an embodiment of the present invention, and FIG. 2 is a schematic cross-sectional view of a multilayer ceramic capacitor taken along line X-X' of FIG. 1A.

Referring to FIGS. 1A and 2, a multilayer ceramic capacitor 200 according to the present embodiment may include a rectangular parallelepiped-shaped ceramic body 210 including dielectric layers 230 and internal electrodes 241 and 241' alternately stacked between the dielectric layers 230, and a pair of external electrodes 222 and 227 each fixed to first and second surfaces S1 and S2 of the ceramic body 210, facing each other, and connected to the internal electrodes 241 and 241'.

Meanwhile, the multilayer ceramic capacitor 200 may have a first length in a first direction (a Z axis direction of FIG. 1A) corresponding to a direction in which the internal electrodes 241 and 241' are stacked, a second length in a second direction (an X axis direction of FIG. 1A) corresponding to a direction in which the pair of external electrodes 222 and 227 face each other, and a third length in a third direction (a Y axis direction of FIG. 1A) corresponding to a direction perpendicular to both of the first and second directions.

In addition, the ceramic body 210 may have a third surface S3 facing a printed circuit board, and each of the pair of external electrodes 222 and 227 may include mounting parts 222a and 227a extended onto the third surface S3 and having a preset length BW by which they are mounted on the printed circuit board, and connection parts C between the pair of external electrodes 222 and 227 and the mounting parts 222a and 227a have a convexly curved shape having a preset corner radius R.

Figure 1B:
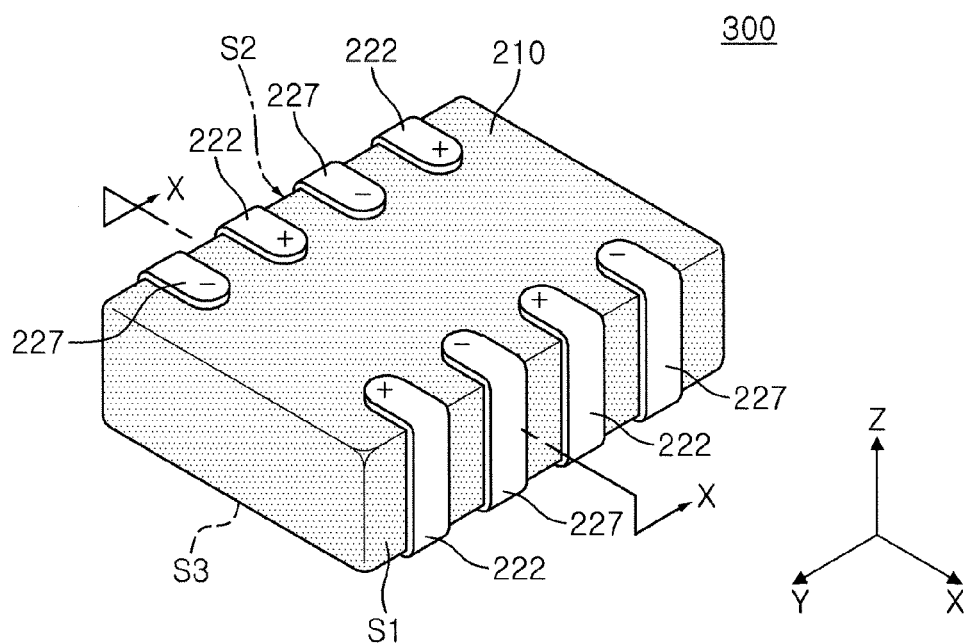
FIG. 1B is a perspective view showing a multi-terminal type multilayer ceramic capacitor according to an embodiment of the present invention.

Meanwhile, FIG. 1B is a perspective view showing a multi-terminal type multilayer ceramic capacitor according to an embodiment of the present invention, and FIG. 2 is a schematic cross-sectional view of a multilayer ceramic capacitor taken along line X-X' of FIG. 1B.

As shown in FIG. 1B, a multi-terminal type multilayer ceramic capacitor 300 may also include a rectangular parallelepiped-shaped ceramic body 210 including dielectric layers 230 and internal electrodes 241 and 241' alternately stacked between the dielectric layers 230; and multiple pairs of external electrodes 222 and 227 each fixed to first and second surfaces S1 and S2 of the ceramic body 210, facing each other, and connected to the internal electrodes 241 and 241', similar to FIG. 1A. Unlike the embodiment of FIG. 1A, in which a single pair of external electrodes is formed in the multilayer ceramic capacitor 200, multiple pairs of external electrodes may be formed in the multilayer ceramic capacitor 300 in the case of the embodiment of FIG. 1B.

Meanwhile, the multilayer ceramic capacitor 300 also may have a first length in a first direction (a Z axis direction of FIG. 1B) corresponding to a direction in which the internal electrodes 241 and 241' are stacked, a second length in a second direction (an X axis direction of FIG. 1B) corresponding to a direction in which the multiple pairs of external electrodes 222 and 227 face each other, and a third length in a third direction (a Y axis direction of FIG. 1B) corresponding to a direction perpendicular to both of the first and second directions.

In addition, the ceramic body 210 may have a third surface S3 facing a printed circuit board, and each of the multiple pairs of external electrodes 222 and 227 may include mounting parts 222a and 227a extended onto the third surface S3 and having a preset length BW by which they are mounted on the printed circuit board, and connection parts C between the multiple pairs of external electrodes 222 and 227 and the mounting parts 222a and 227a may have a convexly curved shape having a preset corner radius R. The corner radius R of the connection part C and the length BW of the mounting part mentioned above may be equally applied to each of the multiple pairs.

In the multilayer ceramic capacitor having the above-mentioned configuration, a tombstone phenomenon generation frequency has been changed according to a size thereof, the corner radius R of the connection parts C between the pair of external electrodes 222 and 227 and the mounting parts 222a and 227a, and the length BW of the mounting parts 222a and 227a. Results thereof have been shown in Table 1 below.

TABLE 1

| Size | Thickness | Type | Corner Radius (R) | Length (C) Of Connection Part | Tombstone Phenomenon Generation Frequency |
|------|-----------|------|-------------------|-------------------------------|-------------------------------------------|
| 0906 | 0.45 | Multi-terminal (4) | 80 | 90 | 25/1000 |
| 0906 | 0.45 | Multi-terminal (4) | 80 | 240 | 12/1000 |
| 0906 | 0.45 | Multi-terminal (4) | 50 | 240 | 0/1000 |
| 0510 | 0.3 | Reverse Two-Terminal | 80 | 40 | 63/1000 |
| 0510 | 0.3 | Reverse Two-Terminal | 80 | 190 | 32/1000 |
| 0510 | 0.3 | Reverse Two-Terminal | 50 | 190 | 0/1000 |
| 0510 | 0.2 | Reverse Two-Terminal | 80 | 40 | 30/1000 |
| 0510 | 0.2 | Reverse Two-Terminal | 80 | 190 | 18/1000 |
| 0510 | 0.2 | Reverse Two-Terminals | 50 | 190 | 0/1000 |
| 0306 | 0.2 | Reverse Two-Terminal | 80 | 40 | 21/1000 |
| 0306 | 0.2 | Reverse Two-Terminal | 80 | 90 | 8/1000 |
| 0306 | 0.2 | Reverse Two-Terminal | 50 | 90 | 0/1000 |

In Table 1, size indicates a length in the second direction (the X axis direction of FIGS. 1A and 1B) and the third direction (the Y axis direction of FIGS. 1A and 1B) of the multilayer ceramic capacitor. For example, a reverse two terminal type of size of 0510 represents that a length in the second direction is 5 mm and a length in the third direction is 10 mm. Thickness indicates a length in the first direction (the Z axis direction of FIGS. 1A and 1B) of the multilayer ceramic capacitor.

Figure 3:
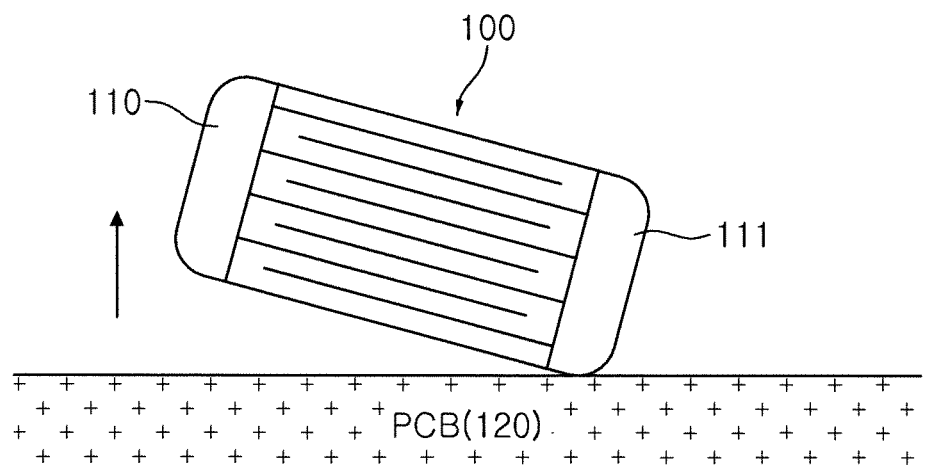
FIG. 3 is a view describing a tombstone phenomenon.

As shown in FIG. 3, a tombstone phenomenon is a phenomenon in which, when a multilayer ceramic capacitor 100 is mounted on a printed circuit board 120, an external electrode on any one side of external electrodes 110 and 111 of the multilayer ceramic capacitor 100 stands up in the manner of a tombstone due to the surface tension of fusion welding.

It may be appreciated from Table 1 that the tombstone phenomenon generation frequency is reduced in accordance with a reduction in the corner radius R even in the multilayer ceramic capacitor having the same size and is also changed in accordance with the length BW of the mounting part C.

Therefore, according to an embodiment of the present invention, it may be appreciated from the above Table 1 that in the case of the reverse type multilayer ceramic capacitor 200 as shown in FIG. 1A, having the third length longer than the second length, particularly, when the first length is 0.2 mm, the second length is 0.3 mm, and the third length is 0.6 mm, the tombstone phenomenon generation frequency is minimized in the case of a corner radius R of 50 µm or less and a length BW of the mounting part of 50 µm or more and 100 µm or less.

In addition, according to an embodiment of the present invention, it may be appreciated that in the case of the reverse type multilayer ceramic capacitor 200 as shown in FIG. 1A having the third length longer than the second length, particularly, when the first length is 0.3 mm, the second length is 0.5 mm, and the third length is 1.0 mm, the tombstone phenomenon generation frequency is minimized in the case of a corner radius R of 50 µm or less and a length BW of the mounting part of 50 µm or more and 200 µm or less.

In addition, according to an embodiment of the present invention, it may be appreciated that in the case of the multi-terminal type multilayer ceramic capacitor 300 as shown in FIG. 1B, particularly, when the first length is 0.45 mm, the second length is 0.6 mm, and the third length is 0.9 mm, the tombstone phenomenon generation frequency is minimized in the case of a corner radius R of 50 µm or less and a length BW of the mounting part of 100 µm or more and 250 µm or less.

As set forth above, according to the embodiments of the present invention, in a special type (the reverse type (FIG. 1A) or multi-terminal type (FIG. 1B)) of multilayer capacitor, the corner radius R of the connection part C and the length BW of the mounting part of the multilayer ceramic capacitor may be set to have a predetermined range according to a size thereof to thereby increase a contact area between the multilayer ceramic capacitor and the printed circuit board, whereby the tombstone phenomenon may be prevented.

As set forth above, according to the embodiments of the present invention, the tombstone phenomenon may be prevented in the special multilayer capacitor such as the reverse type or the multi-terminal type, whereby defects of the printed circuit board may be reduced.

While the present invention has been described in connection with the embodiments thereof, various modifications and variations can be made without departing from the scope of the present invention. Therefore, the scope of the present invention should be not construed as being limited to the embodiments described herein, but should be defined by the claims appended hereto as well as equivalents thereto.

What is claimed is:

1. A multilayer ceramic capacitor comprising:
   a ceramic body including dielectric layers and internal electrodes stacked between the dielectric layers; and
   a pair of external electrodes each fixed to first and second surfaces of the ceramic body, facing each other, and connected to the internal electrodes, wherein:
   the ceramic body having a third surface facing a printed circuit board and each of the pair of external electrodes including mounting parts extended onto the third surface and having a preset length by which they are mounted on the printed circuit board,
   connection parts between the pair of external electrodes and the mounting parts having a convexly curved shape having a size equal to or smaller than a preset corner radius,
   the multilayer ceramic capacitor has a first length in a first direction corresponding to a direction in which the internal electrodes are stacked, a second length in a second direction corresponding to a direction in which the pair of external electrodes face each other, and a third length in a third direction corresponding to a direction perpendicular to both of the first and second directions, and
   in a reverse type multilayer ceramic capacitor having the third length longer than the second length, when the first length is 0.2 mm, the second length is 0.3 mm, and the third length is 0.6 mm, the corner radius is 50 µm or less and the length of the mounting part is 50 µm or more and 100 µm or less.

2. A multilayer ceramic capacitor comprising:
   a ceramic body including dielectric layers and internal electrodes stacked between the dielectric layers; and
   a pair of external electrodes each fixed to first and second surfaces of the ceramic body, facing each other, and connected to the internal electrodes, wherein:
   the ceramic body having a third surface facing a printed circuit board and each of the pair of external electrodes including mounting parts extended onto the third surface and having a preset length by which they are mounted on the printed circuit board,
   connection parts between the pair of external electrodes and the mounting parts having a convexly curved shape having a size equal to or smaller than a preset corner radius,
   the multilayer ceramic capacitor has a first length in the first direction corresponding to the direction in which the internal electrodes are stacked, a second length in the second direction corresponding to the direction in which the pair of external electrodes face each other, and a third length in the third direction corresponding to the direction perpendicular to both of the first and second directions, and
   in the reverse type multilayer ceramic capacitor having the third length longer than the second length, when the first length is 0.3 mm, the second length is 0.5 mm, and the third length is 1.0 mm, the corner radius is 50 µm or less and the length of the mounting part is 50 µm or more and 200 µm or less.

3. A multilayer ceramic capacitor comprising:
   a ceramic body including dielectric layers and internal electrodes alternately stacked between the dielectric layers; and
   multiple pairs of external electrodes each fixed to first and second surfaces of the ceramic body, facing each other, and connected to the internal electrodes, wherein:
   the ceramic body having a third surface facing a printed circuit board and each of the multiple pairs of external electrodes including mounting parts extended onto the third surface and having a preset length by which they are mounted on the printed circuit board, and connection parts between the multiple pairs of external electrodes and the mounting parts having a convexly curved shape having a size equal to or smaller than a preset corner radius, the multilayer ceramic capacitor has a first length in a first direction corresponding to a direction in which the internal electrodes are stacked, a second length in a second direction corresponding to a direction in which the multiple pairs of external electrodes face each other, and a third length in a third direction corresponding to a direction perpendicular to both of the first and second directions, and wherein when the first length is 0.45 mm, the second length is 0.6 mm, and the third length is 0.9 mm, the corner radius is 50 μm or less and the length of the mounting part is 100 μm or more and 250 μm or less.

* * * * *